(12) United States Patent
Sista et al.

(10) Patent No.: US 10,954,438 B2
(45) Date of Patent: *Mar. 23, 2021

(54) PROCESS FOR IMPROVED HALIDE MATERIALS

(71) Applicant: CURRENT LIGHTING SOLUTIONS, LLC, East Cleveland, OH (US)

(72) Inventors: Srinivas Prasad Sista, Niskayuna, NY (US); Anant Achyut Setlur, Niskayuna, NY (US)

(73) Assignee: CURRENT LIGHTING SOLUTIONS, LLC, East Cleveland, OH (US)

(*) Notice: Subject to any disclaimer, the term of this patent is extended or adjusted under 35 U.S.C. 154(b) by 469 days.

This patent is subject to a terminal disclaimer.

(21) Appl. No.: 15/574,539

(22) PCT Filed: May 18, 2015

(86) PCT No.: PCT/US2015/031300
§ 371 (c)(1),
(2) Date: Nov. 16, 2017

(87) PCT Pub. No.: WO2016/186636
PCT Pub. Date: Nov. 24, 2016

(65) Prior Publication Data
US 2018/0155618 A1 Jun. 7, 2018

(51) Int. Cl.
| | | |
|---|---|---|
| *C09K 11/64* | (2006.01) | |
| *H01L 33/50* | (2010.01) | |
| *C09K 11/61* | (2006.01) | |
| *C09K 11/67* | (2006.01) | |
| *C09K 11/69* | (2006.01) | |
| *C09K 11/62* | (2006.01) | |
| *C09K 11/77* | (2006.01) | |
| *G02F 1/1335* | (2006.01) | |
| *G02F 1/13357* | (2006.01) | |

(52) U.S. Cl.
CPC .......... *C09K 11/645* (2013.01); *C09K 11/615* (2013.01); *C09K 11/616* (2013.01); *C09K 11/628* (2013.01); *C09K 11/675* (2013.01); *C09K 11/676* (2013.01); *C09K 11/696* (2013.01); *C09K 11/7705* (2013.01); *H01L 33/502* (2013.01); *G02F 1/1336* (2013.01); *G02F 1/133514* (2013.01); *G02F 2001/133614* (2013.01); *H01L 2224/48091* (2013.01); *H01L 2224/48247* (2013.01); *H01L 2224/48257* (2013.01); *H01L 2924/181* (2013.01)

(58) Field of Classification Search
CPC .............................. C09K 11/0833; C09K 11/57
See application file for complete search history.

(56) References Cited

U.S. PATENT DOCUMENTS

| | | | |
|---|---|---|---|
| 6,939,481 | B2 | 9/2005 | Srivastava et al. |
| 8,057,706 | B1 | 11/2011 | Setlur et al. |
| 8,491,816 | B2 | 7/2013 | Hong et al. |
| 8,703,016 | B2 | 4/2014 | Nammalwar et al. |
| 8,710,487 | B2 | 4/2014 | Lyons et al. |
| 8,906,724 | B2 * | 12/2014 | Murphy ............... C09K 11/616 438/34 |
| 9,376,615 | B2 * | 6/2016 | Murphy ............... H01L 33/502 |
| 9,385,282 | B2 * | 7/2016 | Setlur ................... H01L 33/502 |
| 9,512,356 | B2 * | 12/2016 | Lyons .................. C09K 11/617 |
| 9,567,516 | B2 * | 2/2017 | Murphy .................... F21K 9/60 |
| 9,580,648 | B2 * | 2/2017 | Murphy ............... C09K 11/616 |
| 9,868,898 | B2 * | 1/2018 | Murphy ............... C09K 11/616 |
| 2012/0305972 | A1 | 12/2012 | Meyer et al. |
| 2015/0054400 | A1 | 2/2015 | Murphy |
| 2015/0132585 | A1 | 5/2015 | Pan et al. |

FOREIGN PATENT DOCUMENTS

| | | |
|---|---|---|
| CN | 102827601 A | 12/2012 |
| EP | 2 629 341 A1 | 8/2013 |
| WO | 2011/073871 A2 | 6/2011 |

(Continued)

OTHER PUBLICATIONS

Notification of reasons for refusal issued in connection with corresponding JP Application No. 2017-558370 dated Mar. 12, 2019, 10 pp.
Hu, Y., et al.,"Preparation and luminescent properties of (Ca1-x,Srx)S:Eu2+ red-emitting phosphor for white LED," Journal of Luminescence, vol. 111, Issue 3, pp. 139-145 (2005).
Paulusz, A.G., "Efficient Mn(IV) Emission in Fluorine Coordination," Journal of Electrochemical Society, vol. 120, Issue 7, pp. 1-6 (1973).
Takahashi, T., and Adachi, S., "Mn4 + -Activated Red Photoluminescence in K2SiF6 Phosphor," Journal of The Electrochemical Society, vol. 155, Issue 12, pp. E183-E188 (2008).
International Search Report and Written Opinion issued in connection with corresponding PCT Application No. PCT/US2015/031300 dated Nov. 11, 2015.

(Continued)

*Primary Examiner* — C Melissa Koslow
(74) *Attorney, Agent, or Firm* — Buckley, Maschoff & Talwalkar LLC

(57) ABSTRACT

Synthesizing a color stable $Mn^{4+}$ doped phosphor by contacting a gaseous fluorine-containing oxidizing agent with a precursor of: $A_aB_bC_cD_dX_x$:$Mn^{4+}$; $A_{ai}B_{bi}C_{ci}D_dX_xY_d$:$Mn^{4+}$; $A^1{}_3G_{2-m-n}Mn_mMg_nLi_3F_{12}O_p$; or $AZF_4$:$Mn^{4+}$. Where A is Li, Na, K, Rb, Cs, or a combination; B is Be, Mg, Ca, Sr, Ba, or a combination; C is Sc, Y, B, Al, Ga, In, Tl, or a combination; D is Ti, Zr, Hf, Rf, Si, Ge, Sn, Pb, or a combination; X is F or a combination of F and one of Br, Cl, and I; Y is O, or a combination of O and one of S and Se; $A^1$ is Na or K, or a combination; G is Al, B, Sc, Fe, Cr, Ti, In, or a combination; Z is La, Ce, Pr, Nd, Pm, Sm, Eu, Gd, Tb, Dy, Ho, Er, Tm, Yb, Lu, Sc, Y, In, or a combination.

17 Claims, 3 Drawing Sheets

(56) References Cited

FOREIGN PATENT DOCUMENTS

| WO | 2014/104143 A1 | 7/2014 |
|---|---|---|
| WO | 2016/186637 A1 | 11/2016 |

OTHER PUBLICATIONS

International Preliminary Report on Patentability issued in connection with corresponding PCT Application No. PCT/US2015/031300 dated Nov. 21, 2017.

* cited by examiner

PROCESS FOR IMPROVED HALIDE MATERIALS

BACKGROUND $Mn^{4+}$-complex fluoride phosphors offer potential advantages for high color rendering/gamut light sources that have high efficacies. However, the sensitivity of the materials to hydrolysis or photo-degradation may limit their use in commercial products. Therefore, improvement in the stability of the materials is desirable.

BRIEF DESCRIPTION

Briefly, in one aspect, the present invention relates to a process for synthesizing a color stable $Mn^{4+}$ doped phosphor. A precursor of formula I, II, III or IV is contacted with a fluorine-containing oxidizing agent in gaseous form at an elevated temperature to form the color stable $Mn^{4+}$ doped phosphor $$A_aB_bC_cD_dX_x:Mn^{4+} \quad (I)$$

$$A_{ai}B_{bi}C_{ci}D_dX_xY_d:Mn^{4+} \quad (II)$$

$$A^1{}_3G_{2-m-n}Mn_mMg_aLi_3F_{12}O_p, \quad (III)$$

$$AZF_4:Mn^{4+} \quad (IV)$$

wherein
A is Li, Na, K, Rb, Cs, or a combination thereof; B is Be, Mg, Ca, Sr, Ba, or a combination thereof;
C is Sc, Y, B, Al, Ga, In, Tl, or a combination thereof;
D is Ti, Zr, Hf, Rf, Si, Ge, Sn, Pb, or a combination thereof; X
is F or a combination of F and at least one of Br, Cl, and I; Y is
O, or a combination of O and at least one of S and Se;
$A^1$ is Na or K, or a combination thereof;
G is Al, B, Sc, Fe, Cr. Ti, In, or a combination thereof:
Z is La, Ce, Pr, Nd, Pm, Sm, Eu, Gd, Tb, Dy, Ho, Er, Tm, Yb, Lu, Sc, Y, In, or a combination thereof;

$0 \leq a < 2$;

$0 \leq b < 1$;

$0 \leq c < 1$;

$0 \leq d \leq 1$;

$0.8 \leq ai \leq 1.2$;

$0.8 \leq bi \leq 1.2$;

$0 \leq ci \leq 1.2$;

$5.0 \leq x \leq 7$;

$0.8 \leq c+d \leq 1.2$;

$a+2b+3c+4d=x;$ $0.8 \leq ci+d \leq 1$;

$5.0 \leq x+d \leq 7.0$ $ai+2bi+3ci+4d=x+2d;$ $0.02 \leq m \leq 0.2$;

$0 \leq n \leq 0.4$; and $0 \leq p < 1$.

In another aspect, the present invention relates to color stable $Mn^{4+}$ doped phosphors that may be produced by the process, and lighting, backlighting light source and liquid crystal display apparatuses that utilize the phosphors.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
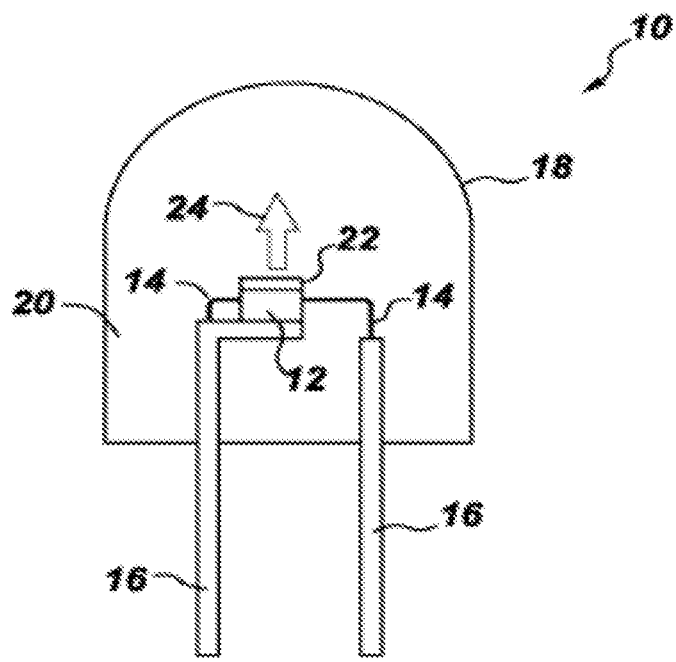
FIG. 1 is a schematic cross-sectional view of a lighting apparatus in accordance with one embodiment of the invention.

In the processes according to the present invention, a non-color stable precursor to a color stable phosphor is annealed, or subjected to an elevated temperature, while in contact with an atmosphere containing a fluorine-containing oxidizing agent. The non-color stable precursor has a nominal composition that is the same as or very similar to the color stable phosphor but it lacks the color stability of the final product.

The precursors of formula I are described in WO 2014/104143, assigned to Mitsubishi Chemical Corporation $$A_aB_bC_cD_dX_x:Mn^{4+} \quad (I)$$

wherein
A is Li, Na, K, Rb, Cs, or a combination thereof;
B is Be, Mg, Ca, Sr, Ba, or a combination thereof;
C is Sc, Y, B, Al, Ga, In, Tl, or a combination thereof;
D is Ti, Zr, Hf, Rf, Si, Ge, Sn, Pb, or a combination thereof;
X is F or a combination of F and at least one of Br, Cl, and I;

$0 \leq a < 2$;

$0 \leq b < 1$;

$0 \leq c < 1$;

$0 \leq d \leq 1$;

$0.8 \leq c+d \leq 1.2$;

$5.0 \leq x \leq 7$; and $a+2b+3c+4d=x.$

Examples of the precursors of formula I include, but are not limited to, compounds of formula $K_2SrAlF_6:Mn^{4+}$. Additional examples and preparation of the compounds are disclosed in WO 2014/104143.

The precursors of formula II are also described in WO 2014/104143

$$A_{ai}B_{bi}C_{ci}D_dX_xY_d:Mn^{4+} \quad (II)$$

wherein

Y is O, or a combination of O and at least one of S and Se;

$0.8 \leq ai \leq 1.2$ $0.8 \leq bi \leq 1.2$ $0 \leq ci \leq 1.2$ $0.8 \leq ci+d \leq 1$ $5.0 \leq x+d \leq 7.0$:

$ai+2bi+3ci+4d=x+2d$; and.

Examples of the precursors of formula II include, but are not limited to, compounds of formula $NaBaTiF_5O$ and $KCaAl_{0.5}Ti_{0.5}F_{5.5}O_{0.5}$. Additional examples and preparation of the compounds are disclosed in WO 2014/104143.

The precursors of formula I and II are described in WO 2014/104143 as having improved water resistance and reduced deterioration over time. However, annealing the materials according to the processes of the present invention may improve properties such as water resistance and long term stability even further.

Precursors of formula III are described in US 2012/0305972, assigned to Koninklijke Philips Electronics N.V.

$$A^1_3G_{2-m-n}Mn_mMg_nLi_3F_{12}O_p, \quad (III)$$

wherein $A^1$ is Na or K, or a combination thereof;

G is Al, B, Sc, Fe, Cr, Ti, In, or a combination thereof;

$0.02 \leq m \leq 0.2$, $0 \leq n \leq 0.4$; and $0 \leq p < 1$.

An example of a precursor of formula III $Na_3Al_{1.94}Mn_{0.03}Mg_{0.03}Li_3F_{12}$. Preparation of the precursors is disclosed in US 2012/0305972.

Precursors of formula IV are described in CN 102827601, assigned to Fujian Institute of Structure of Matter $$AZF_4:Mn^{4+} \quad (IV)$$

wherein

Z is La, Ce, Pr, Nd, Pm, Sm, Eu, Gd, Tb, Dy, Ho, Er, Tm, Yb, Lu, Sc, Y, In, or a combination thereof.

An example of a precursor of formula IV is $NaYF_4:Mn^{4+}$. Preparation of the precursors is disclosed in CN 102827601.

Although the inventors do not wish to be held to any particular theory to explain the improvement in color stability that can result from subjecting the precursor to a process according to an embodiment of the present invention, it is postulated that the precursor may contain defects such as dislocations, $F^-$ vacancies, cation vacancies, $Mn^{3+}$ ions, $Mn^{2+}$ ions, $OH^-$ replacement of $F^-$, or surface or interstitial $H^+/OH^-$ groups that provide non-radiative recombination pathways, and these are healed or removed by exposure to the oxidizing agent at elevated temperature.

The temperature at which the precursor is contacted with the fluorine-containing oxidizing agent may range from about 200° C. to about 700° C., particularly from about 350° C. to about 600° C. during contact, and in some embodiments from about 200° C. to about 700° C. In various embodiments of the present invention, the temperature is at least 100° C., particularly at least 225° C., and more particularly at least 350° C. The phosphor precursor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours. In a specific embodiment, the precursor is contacted with the oxidizing agent for a period of at least eight hours and a temperature of at least 250° C., for example, at about 250° C. for about four hours and then at a temperature of about 350° C. for about four hours.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$KrF, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The manner of contacting the precursor with the fluorine-containing oxidizing agent is not critical and may be accomplished in any way sufficient to convert the precursor to a color stable phosphor having the desired properties. In some embodiments, the chamber containing the precursor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $I+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of ≤1.7, particularly ≤1.6, and more particularly ≤1.5. In particular embodiments, the diluent material is of formula II, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is in an embodiment coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
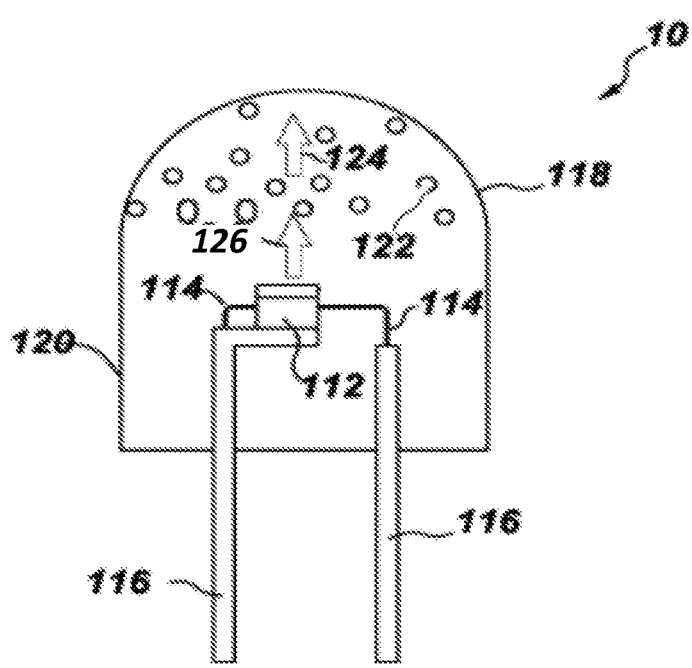
FIG. 2 is a schematic cross-sectional view of a lighting apparatus in accordance with another embodiment of the invention.

FIG. 2 illustrates a second structure of the system according to an embodiment of the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
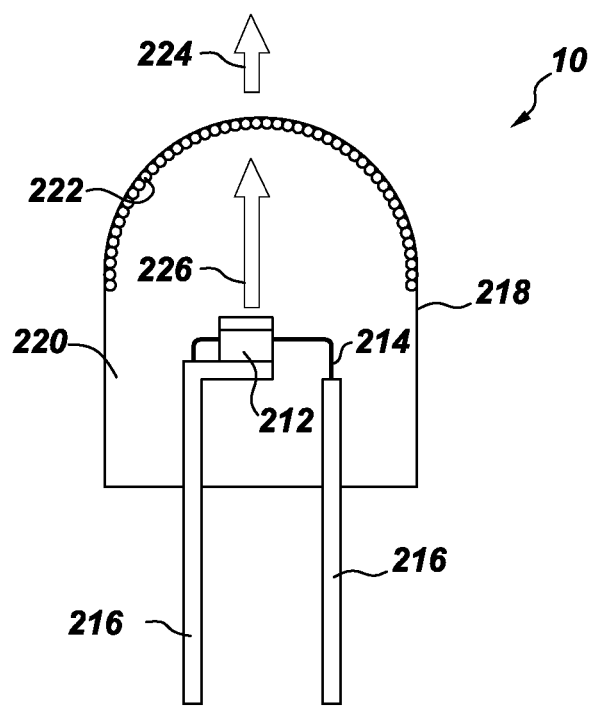
FIG. 3 is a schematic cross-sectional view of a lighting apparatus in accordance with yet another embodiment of the invention.

FIG. 3 illustrates a third possible structure of the system according to an embodiment of the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is in an embodiment coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, in an embodiment with a negligible amount of absorption.

Figure 4:
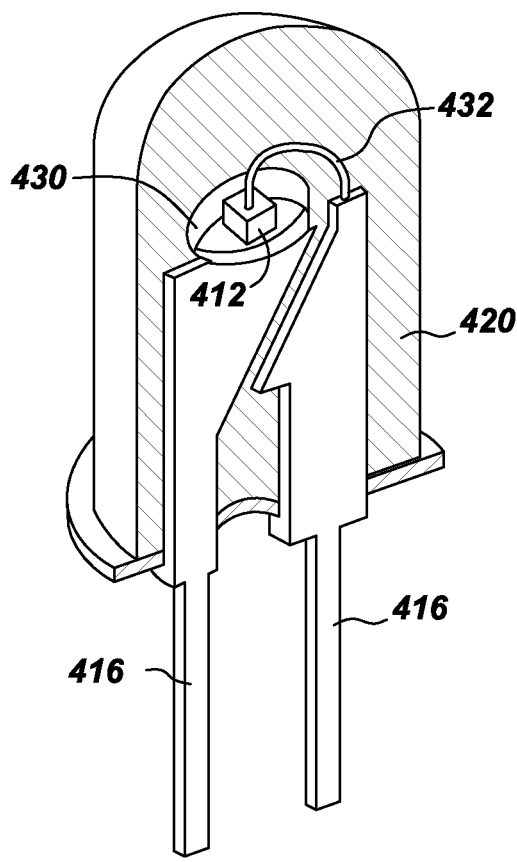
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
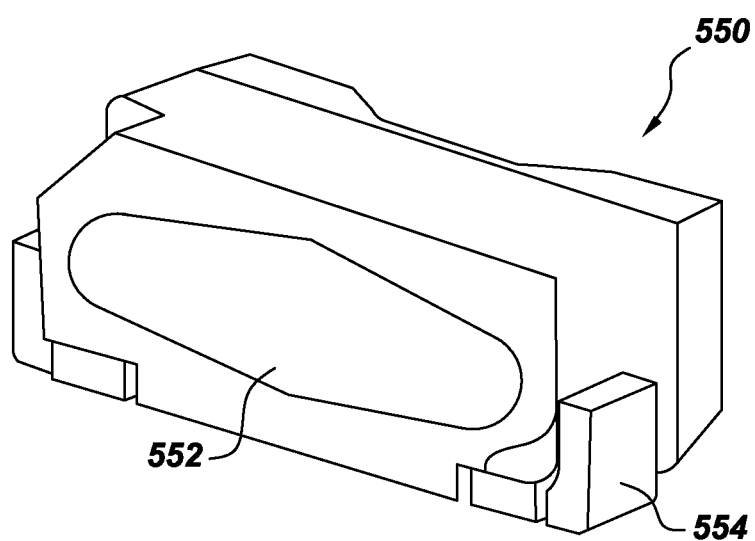
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. In other embodiments, the LED lamp of FIGS. 1-4 may be used as a backlighting light source apparatus disposed on a back surface of a liquid crystal panel. Devices having a display including a semiconductor light source; and a color stable $Mn^{4+}$ doped phosphor include, but are not limited to, TVs, computers, smartphones, tablet computers and other handheld devices.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, in an embodiment with a negligible amount of absorption.

In addition to the color stable $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Quantum dots of any desired color may also be used in phosphor composition 22, or may be disposed in a layer separate from phosphor composition 22. Other materials suitable for use in phosphor compostion 22 include electroluminescent polymers such as polyfluorenes, in an embodiment poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:

$((Sr_{1-z}(Ca, Ba, Mg, Zn)_z)_{1-(x+w)}(Li, Na, K, Rb)_w(Ce_x)_3 (Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$;

$(Ca, Ce)_3Sc_2Si_3O_{12}$ (CaSiG);

$(Sr,Ca,Ba)_3Al_{1-x}Si_xO_{4+x}F_{1-x}:Ce^{3+}$ (SASOF));

$(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$;

$(Sr,Ca)_{10}(PO_4)_6*vB_2O_3:Eu^{2+}$ (wherein $0<v\leq1$); $Sr_2Si_3O_8*2SrCl_2:Eu^{2+}$;

$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$;

$(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$;

$ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-60}O_{12-3/2\alpha}:Ce^{3+}$ (wherein $0\leq\alpha\leq0.5$);

$(Ca,Sr)_8(Mg,Zn)(SiO_4)_4Cl_2:Eu^{2+},Mn^{2+}$; $Na_2Gd_2B_2O_7:Ce^{3+},Tb^{3+}$;

$(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$;

$(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$;

$(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq1$, $0<v\leq0.1$, and $0\leq w\leq0.2$); $(Y,Lu,Gd)_{2-\varphi}Ca_\varphi Si_4N_{6+\varphi}C_{1-\varphi}:Ce^{3+}$, (wherein $0\leq\varphi\leq0.5$); $(Lu,Ca,Li,Mg,Y)$, $\alpha$-SiAlON doped with $Eu^{2+}$ and/or $Ce^{3+}$; $(Ca,Sr,Ba)SiO_2N_2:Eu^{2+},Ce^{3+}$; $\beta$-SiAlON:$Eu^{2+}$, $3.5MgO*0.5MgF_2*GeO_2:Mn^{4+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq t\leq0.2$, $s+t>0$); $(Sr,Ca)AlSiN_3:Eu^{2+}$ and $Ca_{1-o-\chi-\varphi}Ce_o(Li,Na)_\chi Eu_\varphi Al_{1+o-\chi}Si_{1-o+\chi}N_3$, (where $0\leq o\leq0.2$, $0\leq\chi\leq0.4$, $0\leq\varphi\leq0.2$).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is in an embodiment produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

The color stable $Mn^{4+}$ doped phosphors may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

Example 1

A sample of $Na_2Ba_{0.5}AlF_6:Mn^{4+}$ is placed in a furnace chamber. The furnace chamber is evacuated using a mechanical pump and purged multiple times with nitrogen and nitrogen, fluorine mixtures. After several pump and purge cycles, the furnace chamber is filled with an atmosphere containing 20% fluorine gas and 80% nitrogen gas to a pressure of about one atmosphere. The chamber is then heated to about 540° C. After holding for about twelve hours, the chamber is cooled to room temperature. The fluorine nitrogen mixture is evacuated, the chamber is filled and purged several times with nitrogen to ensure the complete removal of fluorine gas before opening the chamber.

Example 2

A sample of $NaBaTiF_5O:Mn^{4+}$ is placed in a furnace chamber. The furnace chamber is evacuated using a mechanical pump and purged multiple times with nitrogen and nitrogen, fluorine mixtures. After several pump and purge cycles, the furnace chamber is filled with an atmosphere containing 20% fluorine gas and 80% nitrogen gas to a pressure of about one atmosphere. The chamber is then heated to about 500° C. After holding for about four hours, the chamber is cooled to room temperature. The fluorine nitrogen mixture is evacuated, the chamber is filled and purged several times with nitrogen to ensure the complete removal of fluorine gas before opening the chamber.

While only certain features of the invention have been illustrated and described herein, many modifications and changes will occur to those skilled in the art. It is, therefore, to be understood that the appended claims are intended to cover all such modifications and changes as fall within the true spirit of the invention.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A process for synthesizing a color stable $Mn^{4+}$ doped phosphor, the process contacting a precursor of formula I, II, III, or IV

    (I)

    (II)

    (III)

    (IV)

with a fluorine-containing oxidizing agent in gaseous form at an elevated temperature to form the color stable $Mn^{4+}$ doped phosphor;

wherein
A is Li, Na, K, Rb, Cs, or a combination thereof;
B is Be, Mg, Ca, Sr, Ba, or a combination thereof;
C is Sc, Y, B, Al, Ga, In, Tl, or a combination thereof;
D is Ti, Zr, Hf, Rf, Si, Ge, Sn, Pb, or a combination thereof;
X is F or a combination of F and at least one of Br, Cl, and I;
Y is O, or a combination of O and at least one of S and Se;
Al is Na or K, or a combination thereof;
G is Al, B, Sc, Fe, Cr, Ti, In, or a combination thereof;
Z is La, Ce, Pr, Nd, Pm, Sm, Eu, Gd, Tb, Dy, Ho, Er, Tm, Yb, Lu, Sc, Y, In, or a combination thereof;
$0 \le a < 2$;
$0 \le b < 1$;
$0 \le c < 1$;
$0 \le d \le 1$;
$0.8 \le ai \le 1.2$;
$0.8 \le bi \le 1.2$;
$0 \le ci \le 1.2$;
$5.0 \le x \le 7$;
$0.8 \le c+d \le 1.2$;
$a+2b+3c+4d=x$;
$0.8 \le ci+d \le 1$;
$5.0 \le x+d \le 7.0$;
$ai+2bi+3ci+4d=x+2d$;
$0.02 \le m \le 0.2$;
$0 \le n \le 0.4$; and
$0 \le p < 1$.

2. A process according to claim 1, wherein the precursor is formula I.

3. A process according to claim 1, wherein X is F.

4. A process according to claim 1, wherein Y is O.

5. A process according to claim 1, wherein B is Ca, Sr, Ba, or a combination thereof.

6. A process according to claim 1, wherein C is Al, Ga, or a combination thereof.

7. A process according to claim 1, wherein D is Si, Ge, Ti, or a combination thereof.

8. A process according to claim 1, wherein the fluorine-containing oxidizing agent is $F_2$.

9. A process according to claim 1, wherein the temperature ranges from about 200° C. to about 700° C.

10. A color stable $Mn^{4+}$ doped phosphor prepared by a process according to claim 1.

11. A lighting apparatus comprising a semiconductor light source; and color stable $Mn^{4+}$ doped phosphor prepared by a process according to claim 1.

12. A backlighting light source apparatus comprising a semiconductor light source; and color stable $Mn^{4+}$ doped phosphor prepared by a process according to claim 1.

13. A liquid crystal display apparatus comprising: a liquid crystal panel; and the backlighting light source apparatus according to claim 12 disposed on a back surface of the liquid crystal panel.

14. A process for synthesizing a color stable $Mn^{4+}$ doped phosphor, the process comprising contacting a precursor of formula I with a fluorine-containing oxidizing agent in gaseous form at an elevated temperature to form the color stable $Mn^{4+}$ doped phosphor

    (I)

wherein
A is Li, Na, K, Rb, Cs, or a combination thereof;
B is Be, Mg, Ca, Sr, Ba, or a combination thereof;
C is Sc, Y, B, Al, Ga, In, Tl, or a combination thereof;

D is Ti, Zr, Hf, Rf, Si, Ge, Sn, Pb, or a combination thereof;

X is F or a combination of F and at least one of Br, Cl, and I;

$0 \leq a < 2$;

$0 \leq b < 1$;

$0 \leq c < 1$;

$0 \leq d \leq 1$;

$0.8 \leq c+d \leq 1.2$;

$5.0 \leq x \leq 7$; and $a+2b+3c+4d=x$.

15. A process for synthesizing a color stable Mn$^{4+}$ doped phosphor, the process comprising contacting a precursor of formula II with a fluorine-containing oxidizing agent in gaseous form at an elevated temperature to form the color stable Mn$^{4+}$ doped phosphor $$A_{ai}B_{bi}C_{ci}D_dX_xY_d:Mn^{4+} \quad \text{(II)}$$

wherein

Y is O, or a combination of O and at least one of S and Se;

$0.8 \leq ai \leq 1.2$ $0.8 \leq bi \leq 1.2$ $0 \leq ci \leq 1.2$ $0.8 \leq ci+d \leq 1$ $5.0 \leq x+d \leq 7.0$;

$ai+2bi+3ci+4d=x+2d$; and

Y is O, or a combination of O and at least one of S and Se, wherein

A is Li, Na, K, Rb, Cs, or a combination thereof;

B is Be, Mg, Ca, Sr, Ba, or a combination thereof;

C is Sc, Y, B, Al, Ga, In, Tl, or a combination thereof;

D is Ti, Zr, Hf, Rf, Si, Ge, Sn, Pb, or a combination thereof;

X is F or a combination of F and at least one Br, Cl and I; and $0 \leq d \leq 1$.

16. A process for synthesizing a color stable Mn$^{4+}$ doped phosphor, the process comprising contacting a precursor of formula III with a fluorine-containing oxidizing agent in gaseous form at an elevated temperature to form the color stable Mn$^{4+}$ doped phosphor $$A^1{}_3G_{2-m-n}Mn_mMg_nLi_3F_{12}O_p, \quad \text{(III)}$$

wherein

A$^1$ is Na or K, or a combination thereof;

G is Al, B, Sc, Fe, Cr, Ti, In, or a combination thereof;

$0.02 \leq m \leq 0.2$;

$0 \leq n \leq 0.4$; and $0 \leq p < 1$.

17. A process for synthesizing a color stable Mn$^{4+}$ doped phosphor, the process comprising contacting a precursor of formula IV with a fluorine-containing oxidizing agent in gaseous form at an elevated temperature to form the color stable Mn$^{4+}$ doped phosphor $$AZF_4:Mn^{4+} \quad \text{(IV)}$$

wherein

Z is La, Ce, Pr, Nd, Pm, Sm, Eu, Gd, Tb, Dy, Ho, Er, Tm, Yb, Lu, Sc, Y, In, or a combination thereof, and wherein A is Li, Na, K, Rb, Cs, or a combination thereof.

* * * * *